(12) United States Patent
Wang et al.

(10) Patent No.: US 12,392,560 B2
(45) Date of Patent: Aug. 19, 2025

(54) THERMAL DISSIPATION MODULE

(71) Applicant: Acer Incorporated, New Taipei (TW)

(72) Inventors: Yung-Chih Wang, New Taipei (TW);
Jau-Han Ke, New Taipei (TW);
Wen-Neng Liao, New Taipei (TW);
Cheng-Wen Hsieh, New Taipei (TW)

(73) Assignee: Acer Incorported, New Taipei (TW)

( * ) Notice: Subject to any disclaimer, the term of this patent is extended or adjusted under 35 U.S.C. 154(b) by 0 days.

(21) Appl. No.: 18/505,136

(22) Filed: Nov. 9, 2023

(65) Prior Publication Data

US 2024/0068754 A1 Feb. 29, 2024

Related U.S. Application Data

(60) Division of application No. 18/169,857, filed on Feb. 15, 2023, now Pat. No. 11,852,420, which is a
(Continued)

(30) Foreign Application Priority Data

Sep. 16, 2015 (TW) .................................. 104130535
Mar. 23, 2016 (TW) .................................. 105108930
Apr. 6, 2016 (TW) .................................. 105110817

(51) Int. Cl.
*F28D 15/02* (2006.01)
*F28F 1/00* (2006.01)
(Continued)

(52) U.S. Cl.
CPC ........... *F28D 15/025* (2013.01); *F28D 15/02* (2013.01); *F28D 15/0266* (2013.01);
(Continued)

(58) Field of Classification Search
CPC ............... G06F 1/203; G06F 2200/201; F28D 15/0275; F28D 15/043; F28D 15/0266
See application file for complete search history.

(56) References Cited

U.S. PATENT DOCUMENTS 5,309,457 A * 5/1994 Minch .................. H01S 5/4025
165/104.33
5,579,830 A * 12/1996 Giammaruti ............ F28D 20/02
165/104.27
(Continued)

*Primary Examiner* — Gordon A Jones
(74) *Attorney, Agent, or Firm* — JCIPRNET

(57) ABSTRACT

A heat dissipation module used for an electronic device is provided. The electronic device has a heat source. The heat dissipation module includes an evaporator, a plurality of heat conducting components, a pipe connected to the evaporator to form a loop, and a working fluid filled in the loop. An exterior of the evaporator has a heat conducting zone thermally contacted with the heat source to absorb heat generated from the heat source. The heat conducting components are disposed in the evaporator, located at an interior of the evaporator corresponding to the heat conducting zone. The heat conducting components are in pillar shape or rib shape respectively. The working fluid in liquid passes through the evaporator, absorbs heat, and is transformed into vapor to flow out of the evaporator. Each of the heat conducting components in rib shape is oriented in a flow direction of the working fluid.

1 Claim, 11 Drawing Sheets

Related U.S. Application Data division of application No. 16/792,195, filed on Feb. 15, 2020, now Pat. No. 11,609,048, which is a division of application No. 15/796,858, filed on Oct. 30, 2017, now Pat. No. 10,634,435, which is a continuation of application No. 15/189,291, filed on Jun. 22, 2016, now Pat. No. 9,835,382.

(51) Int. Cl.
  *F28F 13/08* (2006.01)
  *G06F 1/20* (2006.01)
  *H05K 7/20* (2006.01)
  *F28D 21/00* (2006.01)

(52) U.S. Cl.
  CPC ............ *F28F 1/006* (2013.01); *F28F 13/08* (2013.01); *G06F 1/203* (2013.01); *H05K 7/20336* (2013.01); *F28D 2021/0028* (2013.01)

(56) References Cited

U.S. PATENT DOCUMENTS

| | | | |
|---|---|---|---|
| 6,900,990 B2 * | 5/2005 | Tomioka | H01L 23/473 361/679.48 |
| 9,721,869 B2 * | 8/2017 | Sun | F28D 15/04 |
| 2007/0006994 A1 * | 1/2007 | Liu | F28D 15/043 165/104.33 |

* cited by examiner

THERMAL DISSIPATION MODULE

CROSS-REFERENCE TO RELATED APPLICATION

This application is a divisional application of and claims the priority benefit of U.S. application Ser. No. 18/169,857, filed on Feb. 15, 2023, now allowed. The prior U.S. application Ser. No. 18/169,857 is a divisional application of and claims the priority benefit of U.S. application Ser. No. 16/792,195, filed on Feb. 15, 2020, now patented. The prior U.S. application Ser. No. 16/792,195 is a divisional application of and claims the priority benefit of U.S. application Ser. No. 15/796,858, filed on Oct. 30, 2017, now patented. The prior U.S. application Ser. No. 15/796,858 is a continuation application of and claims the priority benefit of a prior application Ser. No. 15/189,291, filed on Jun. 22, 2016, which claims the priority benefit of Taiwan application serial no. 105110817, filed on Apr. 6, 2016, Taiwan application serial no. 105108930, filed on Mar. 23, 2016, and Taiwan application serial no. 104130535, filed on Sep. 16, 2015. The entirety of each of the above-mentioned patent applications is hereby incorporated by reference herein and made a part of this specification.

BACKGROUND OF THE INVENTION

1. Field of the Invention

The present invention relates to a heat dissipation module.

2. Description of Related Art

With the increasing development of hi-tech industry, mobile devices such as mobile phones and tablet PCs have become one of the most indispensable necessities of our daily life. As people become growingly rely on the mobile devices, usages times are also getting longer and longer. However, prolonged use of the mobile devices usually causes the integrated circuits of the mobile devices to crash due to overheating, and thereby is very inconvenient.

As the mobile phones or the tablet PCs are restricted by the size and weight requirements and are unable to use a fan as a heat dissipation means. A conventional method of heat dissipation is to attach a heat dissipation material thereon or to use a heat pipe. Nevertheless, under the operation of high power electronic components within the mobile devices, a heat dissipation efficiency provided by the aforesaid heat dissipation method is still very limited.

SUMMARY OF THE INVENTION

The present invention provides a heat dissipation module, having a compact structure disposition and improved heat dissipation efficiency.

The heat dissipation module of the present invention is suitable for an electronic device. The electronic device has a heat source. The heat dissipation module includes an evaporator, a plurality of heat conducting components, a pipe connected to the evaporator to form a loop, and a working fluid filled in the loop. An exterior of the evaporator has a heat conducting zone thermally contacted with the heat source to absorb heat generated from the heat source. The heat conducting components are disposed in the evaporator, located at an interior of the evaporator corresponding to the heat conducting zone. The heat conducting components are in pillar shape or rib shape respectively. The working fluid in liquid passes through the evaporator, absorbs heat, and is transformed into vapor to flow out of the evaporator. Each of the heat conducting components in rib shape is oriented in a flow direction of the working fluid.

In view of above, in the aforementioned embodiment of the present invention, through a structural characteristic of the evaporator of the heat dissipation module, i.e., having the heat conducting zone at the exterior thereof to thermally contact with the heat source, can increase a thermal contact area between the heat source and the evaporator. In addition, the working fluid as being filled in the loop formed after connecting the pipe to the evaporator can efficiently absorb heat while passing through an inner space of the evaporator corresponding to the heat conducting zone. Thus, the working fluid transforms to vapor and carries away the heat by flowing away from the inner space of the evaporator, to attain a heat dissipation effect.

To make the above features and advantages of the invention more comprehensible, several embodiments accompanied with drawings are described in detail as follows.

DESCRIPTION OF THE EMBODIMENTS

Figure 1:
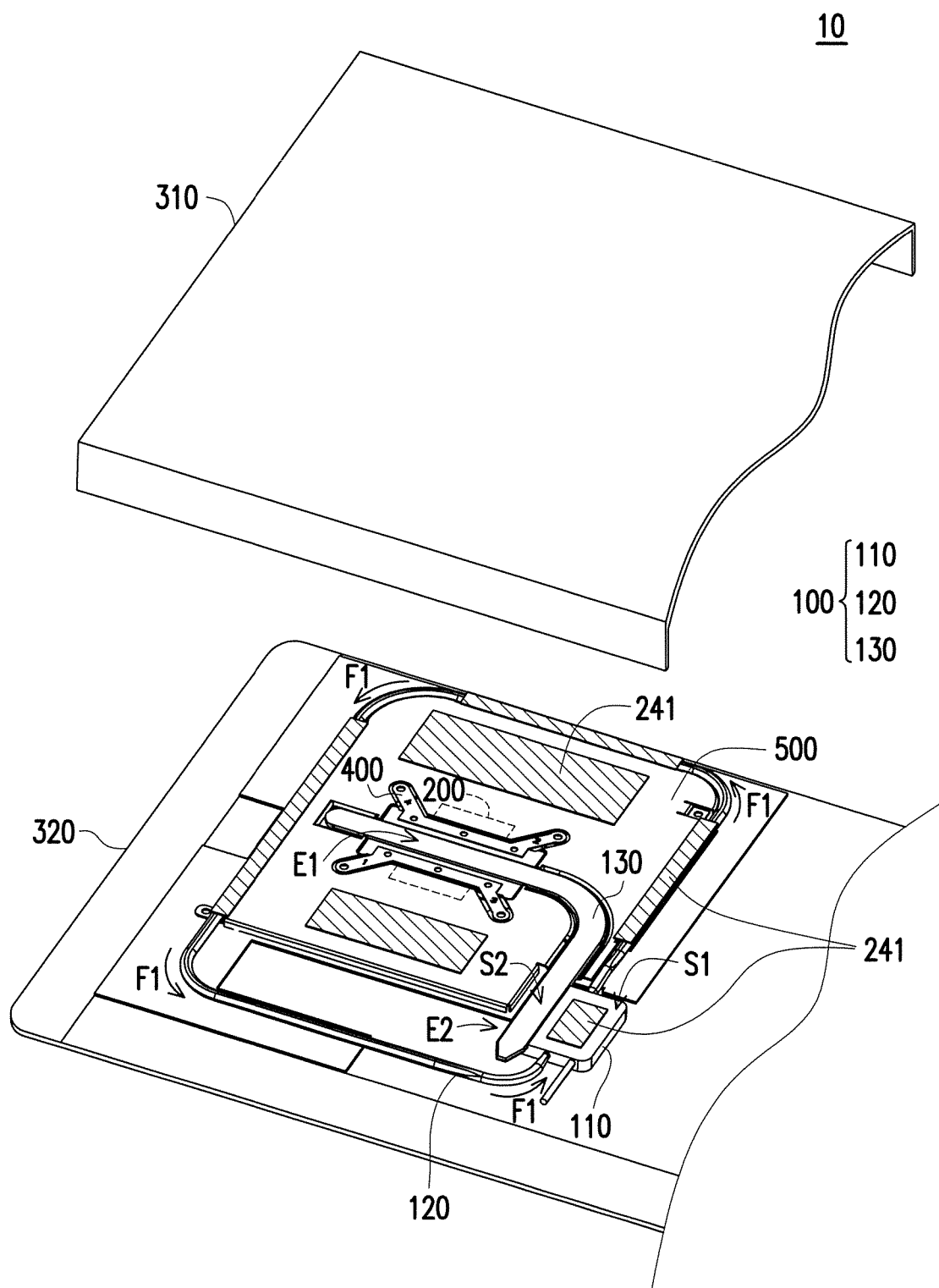
FIG. 1 is a partial exploded view of an electronic device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a partial exploded view of an electronic device according to an embodiment of the present invention. Referring to FIG. 1, in the present embodiment, electronic device 10 is, for example, a portable electronic device such as a notebook computer or a tablet PC, which has a slim and light appearance for complying with demands of convenient carrying. Nevertheless, with increasing demands in computation and display, an electronic device 10 has to be disposed with relative components having a heat dissipation effect in casings 310, 320, so as to meet the requirements in heat dissipation aroused in correspondence to the aforesaid demands in performance. Accordingly, the electronic device 10 includes a heat source 200 and a heat dissipation module 100, wherein the heat source 200 is, for example, an electronic module such as a central processor or a display chip, and the heat dissipation module 100 can absorb a heat generated from the heat source 200 and can dissipate the heat from the other parts of the electronic device 10.

In the present embodiment, the heat dissipation module 100 is, for example, a siphon type heat dissipation component, which includes an evaporator 110, a pipe 120 and a working fluid F1 (only arrows representing a flow direction thereof are provided in the drawing). The evaporator 110 is configured to thermally contact the heat source 200, so as to absorb the heat from the heat source 200. The pipe 120 is connected to the evaporator 110 to form a loop, and the working fluid F1 is filled in the loop. When flowing through the evaporator 110, a phase transformation of the working fluid F1 is occurred via heat absorption or dissipation. For example, the working fluid F1 transforms from liquid to vapor by absorbing the heat, and then transforms to liquid again after heat dissipation. The vapor state working fluid F1 moves away from the evaporator 110 to carry away the heat and flows through the other parts of the electronic device 10 with lower temperature along with the pipe 120, in order to enable the working fluid F1 to undergo a phase change condensation (transforming from the vapor state back to the liquid state). Thus, the heat is able to be dissipated away from the electronic device 10.

In detail, the heat dissipation module 100 of the present embodiment further comprises a heat pipe 130, which is thermally contacted between the heat source 200 and the evaporator 110 to transfer the heat generated from the heat source 200 to the evaporator 110. Further speaking, as shown in FIG. 1, a first end E1 of the heat pipe 130 is clasped on a plate body 500 of the electronic device 10 and structurally contacted on the heat source 200 by the clasp members 400. A second end E2 of the heat pipe 130 is structurally contacted to the evaporator 110 by welding, and is substantially contacted to a recess 112 of a portion of an exterior surface S1 of the evaporator 110. Therefore, the heat pipe 130 can transfer the heat generated from the heat source 200 to the recess 112 of the evaporator 110 through a phase transition of another working fluid therein. It is worth noting that, as the disposition shown in FIG. 1, the electronic device 10 in the present embodiment can provide certain heat dissipation effect to the heat source 200 through the plate body 500, i.e., the heat is uniformly distributed to all over the plate body 500 and the heat dissipation module 100 by contacting the heat pipe 130 and the pipe 120 to the plate body 500 together. In other embodiments not being illustrated, the plate body 500 can also be a partial structure or whole structure of the casings 310, 320. Moreover, in the present embodiment, the plate body 500 is made of metal material, so that it can also provide an electromagnetic interference (EMI) shielding effect to the heat source 200 (such as the aforementioned central processor or display chip.)

Figure 2:
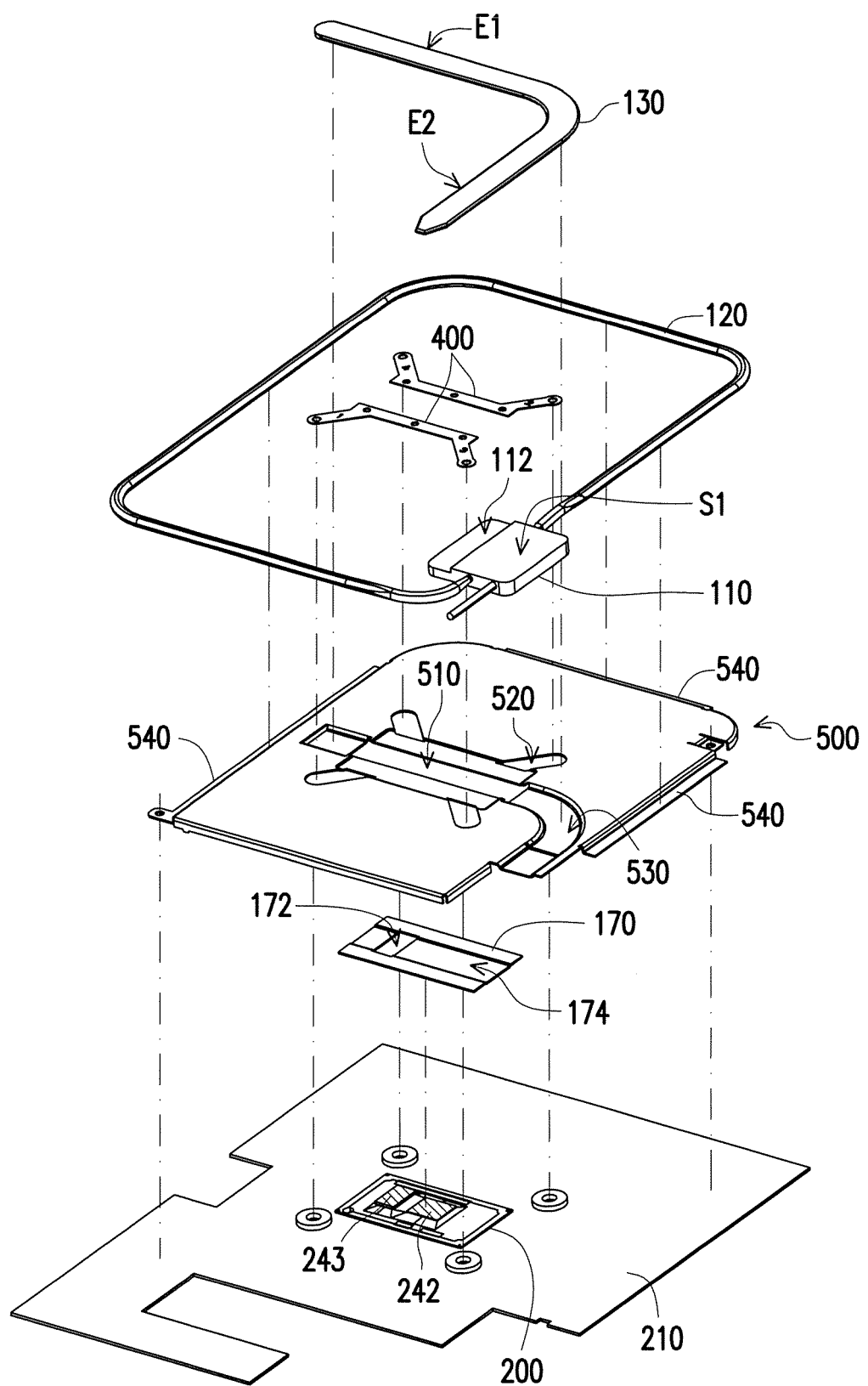
FIG. 2 is an exploded view of the electronic device of FIG. 1.

FIG. 2 is an exploded view of the electronic device of FIG. 1 to illustrate the other elements not shown in FIG. 1. Referring both of FIG. 1 and FIG. 2, further speaking, in the present embodiment, the plate body 500 is assembled to a circuit board 210 via protrusion structures (elements such as fasten components that are known in prior art are omitted here.) The heat dissipation module 100 further comprises a heat conducting sheet 170 is contacted to the heat source 200 (i.e., the electronic module) and substantially located between the plate body 500 and the heat source 200 (i.e., the electronic module), so that a portion of the heat generated from the heat source 200 (i.e., the electronic module) can be transferred to the plate body 500 through the heat conducting sheet 170. Herein, the heat conducting sheet 170 has a recessed main body 174 and an opening 172, and the heat dissipation module 100 further comprises a heat conducting pad 243 and a heat conducting glue 242. The recessed main body 174 of the heat conducting sheet 170 is contacted to the heat source 200 (i.e., the electronic module) through the heat conducting glue 242, and can expose the plate body 500 through an opening 510, so that a portion of the heat pipe 130 is supported on the recessed main body 174. The heat conducting pad 243 is passed through the opening 172 and contacted to the heat pipe 130 disposed at the recessed main body 174. In addition, a central portion of the clasp members 400 are contacted to the plate body 500, and an end of the clasp members 400 is passed through the opening 520 of the plate body 500 and assembled to the circuit board 210 (as the resultant structure shown in FIG. 2, but the form thereof is not limited here), so that forming a state that the heat conducting sheet 170 and the plate body 500 are clasped between the clasp members 400 and the circuit board 210. Thus, the heat conducting sheet 170 and the plate body 500 can be more tightly contacted to the heat source 200 (i.e., the electronic module) through the heat conducting pad 243.

The heat pipe 130 is disposed at the trench 530 of the plate body 500, and the first end E1 of the heat pipe 130 is thermally contacted to the heat source 200 (i.e., the electronic module), and the second end E2 of the heat pipe 130 is thermally contacted to the evaporator 110. Therefore, another portion of the heat generated from the heat source 200 (i.e., the electronic module) is transferred to the evaporator 110 through the heat pipe 130.

Accordingly, a portion of the heat generated from the heat source 200 (i.e., the electronic module) is sequentially transferred to the plate body 500 through the heat conducting glue 242 and the heat conducting sheet 170, and another portion of the heat is transferred to the heat pipe 130 through the heat conducting pad 243, wherein the aforementioned heat transfer paths are close to each other and located at the first end E1 of the heat pipe 130. Thus, the heat transferred to the plate body 500 can also provide a heating effect to the heat pipe 130 because of structural contact thereof. As a result, a portion of the heat generated from the heat source 200 (i.e., the electronic module) can be dissipated through the plate body 500, i.e., the plate body 500 can provide not only an EMI shielding effect by covering the heat source 200 (i.e., the electronic module), but a heat dissipation effect due to properties of the material (such as metal) thereof and relatively large area (compared to the other elements.)

In addition, as shown in FIG. 1, the heat dissipation module 100 can also be further contacted to the casing 310 through the heat conducting pad 241 disposed on the plate body 500. Such that, the heat on the plate body 500 can be further transferred to the casing 310 to attain an effect of dissipating heat away from the electronic device 10.

Figure 3:
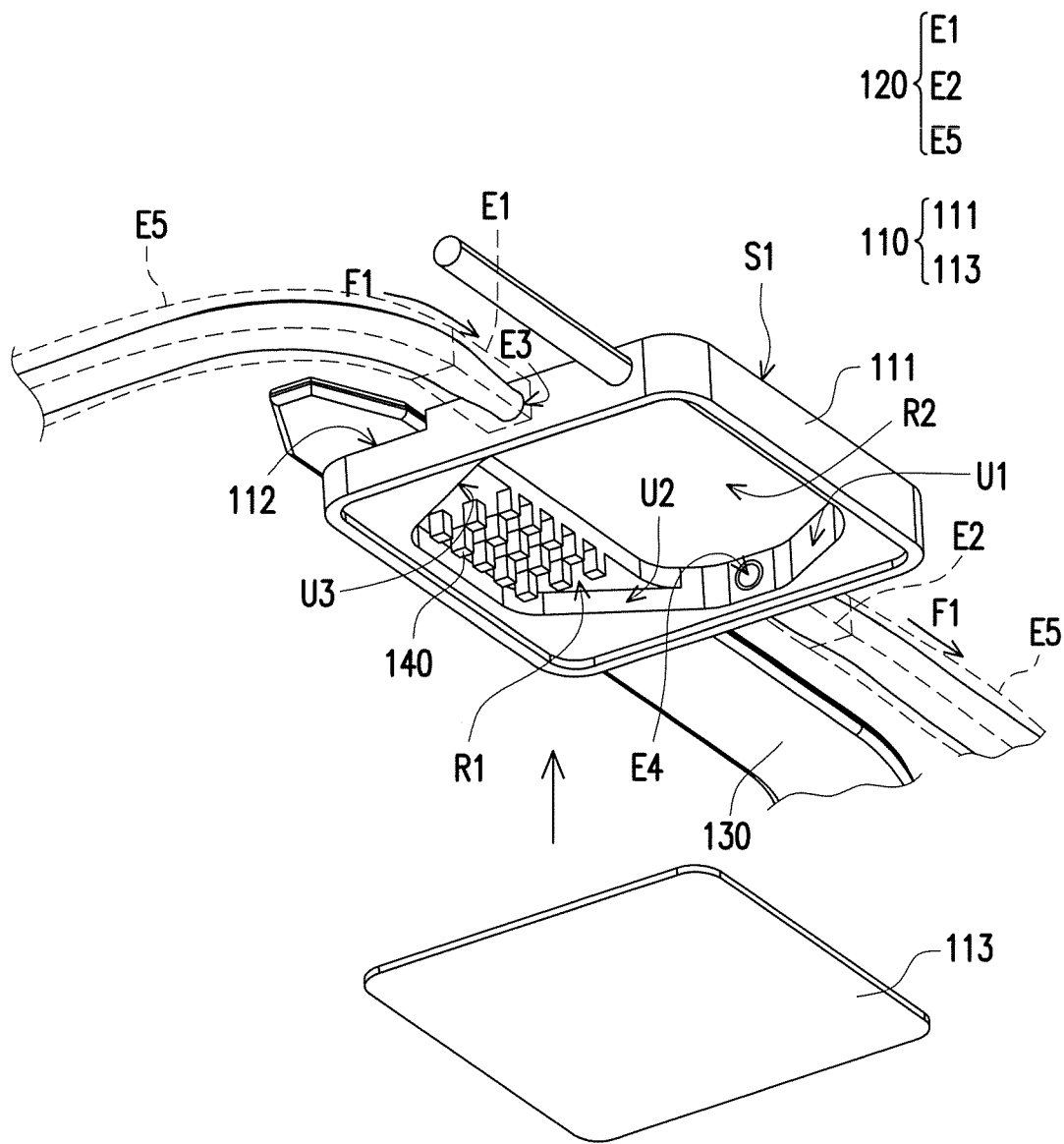
FIG. 3 is a partial schematic view of the heat dissipation module of FIG. 1.
Figure 4:
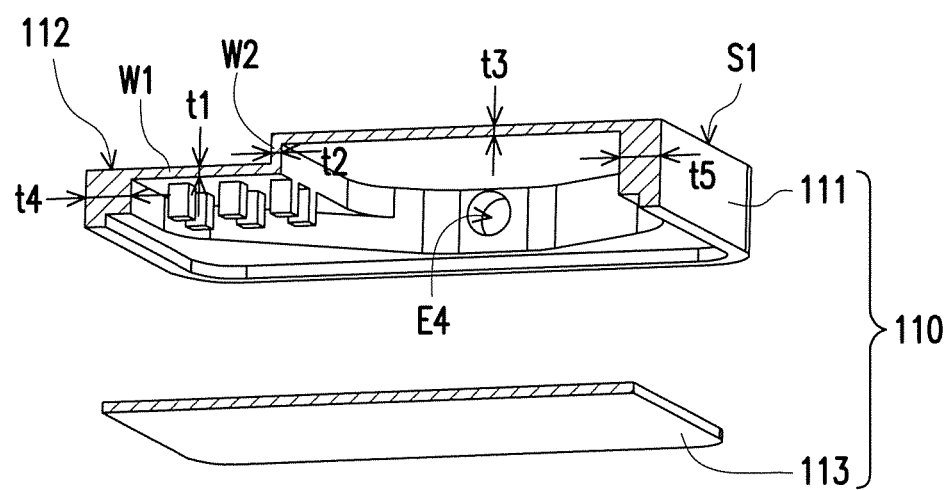
FIG. 4 is a partial sectional view of the evaporator of FIG. 3.

FIG. 3 is a partial schematic view of the heat dissipation module of FIG. 1, such that an internal structure thereof can be successfully identified by partially disassembling the evaporator 110. FIG. 4 is a partial sectional view of the evaporator of FIG. 3. Referring to both of FIG. 3 and FIG. 4, in the present embodiment, the second end E2 of the heat pipe 130 substantially fills up the recess 112. That is, the heat pipe 130 is structurally contacted to walls W1, W2 at the recess 112 of the evaporator 110, so that a thermal contact area of the heat pipe 130 and the evaporator 110 is increased, and a heat conduction efficiency is effectively increased due to a compact disposition of the heat pipe 130 and the evaporator 110 (i.e., the walls W1, W2 can be served as heat conducting walls of the evaporator 110.)

Moreover, a top surface S2 of the heat pipe 130 is coplanar with the exterior surface S1 of the evaporator 110 because of the compact disposition of the aforementioned heat pipe 130 and the evaporator 110 at the exterior surface S1 of the evaporator 110. As a result, in consideration of structure disposition, this configuration can also increase a disposition efficiency of the heat dissipation module 100 and surrounding elements thereof in the electronic device 10, i.e., a space utilization efficiency in the electronic device 10 is increased.

As shown in FIG. 4, portions of the evaporator 110 at the walls W1, W2 are the thinnest of the whole structure thereof, such that the evaporator 110 in the present embodiment can efficiently absorb a heat from the second end E2 of the heat pipe 130. That is, thickness of the walls W1, W2 is smaller than that of the other walls of the evaporator 110, e.g., a thickness t1 and a thickness t2 are substantially smaller than a thickness t4 and a thickness t5. In addition, the second end E2 of the heat pipe 130 is disposed compactly with the recess 112 of the evaporator 110, so that the heat pipe 130 can provide a structural support to the aforementioned walls W1, W2, and thus bring about both effects of increasing heat conduction efficiency and enhancing structure strength. Besides, in another embodiment not being illustrated, the thickness t1 and the thickness t2 can also be substantially smaller than thickness t3, t4 and t5. Similarly, by applying the thickness difference, the heat of the heat pipe 130 can be transfer to the evaporator 110 through the walls with smaller thickness.

As shown in FIG. 3 and FIG. 4, the evaporator 110 is substantially formed by assembling a main body 111 and a cover body 113, in order to form an inner space that the working fluid F1 flows therein, wherein the main body 111 has openings E3, E4 connecting to the pipe 120 that the working fluid F1 flows in or out thereby (The flow direction of the working fluid F1 are presented by the arrows in the figures, but it is not limited thereby. In another embodiment not being illustrated, the working fluid can also flow in a reversed direction.) In addition, the main body 111 has the aforementioned recess 112 and thus forms a protrusion in the inner space thereof. Further speaking, the inner space of the evaporator 110 thus can be separated into a flowing region R2 and a heating region R1, wherein the protrusion thereof is the heating region R1, and a region thereof connected to the pipe 120 and the openings E3, E4 is the flowing region R2. Further illustration will be given below.

In the present embodiment, the heat dissipation module 110 further comprises a plurality of heat conducting components 140, which are disposed in the heating region R1 and located on the wall W1 corresponding to the recess 112. Herein, the plurality of heat conducting components 140 are in pillar shape and arrayed on the wall W1. That is, when the working fluid F1 flows from the opening E3 to the heating region R1 of the evaporator 110, a heat exchange efficiency of the working fluid F1 and the walls W1, W2 can be increased. The heat of the walls W1, W2 connected to the heat pipe 130 is more efficiently exchanged through the heat conducting components 140 extended from the wall W1, so that the working fluid F1 in liquid absorbs the heat and is transformed to the working fluid F1 in vapor, and flows into the pipe 120 through the opening E4.

It is worth noting that, as the structure disposition shown in FIG. 1, the pipe 120 is substantially disposed around the plate body 500. That is, in the present embodiment, the plate body 500 further comprises a plurality of side protrusions 540. At least a portion of the pipe 120 is substantially contacted to the side protrusions 540, wherein a formation method of the contact is not limited here, it can be performed by welding. In other words, all methods, which can form thermal contact between the pipe 120 and the plate body 500 to efficiently transfer the heat from the evaporator 110 to the plate body 500, are suitable in the present embodiment. Accordingly, the working fluid F1 in the evaporator 110 absorbs the heat and is transformed to vapor from liquid, and is collected and transferred to the pipe 120. When the working fluid F1 in vapor is transferred to where the pipe 120 is thermally contacted to the plate body 500, the plate body 500 thus can absorb the heat, in order to provide a condensation effect to the working fluid F1. Therefore, the working fluid F1 in vapor is transformed back to liquid, and can be transferred back to the evaporator 110 through the pipe 120. Herein, an improved heat conduction efficiency is provided due to properties of the plate body 500, which include larger area and material properties of metal. Accordingly, the working fluid F1 in vapor can attain the condensation effect while passing through the plate body 500 along with the pipe 120, such that the working fluid F1 in vapor is transformed back to the working fluid F1 in liquid and returned to the evaporator 110 again through the opening E3.

Moreover, in the evaporator 110, each of the heat conducting components 140 is contacted between the wall W1 of the main body 111 and the cover body 113. Thus, during the assembly of the main body 111 and the cover body 113, the heat conducting components 140 can also serve as a support structure thereof, in order to avoid a deformation of the inner space of the evaporator 110 resulted from improper assembly.

Figure 5:
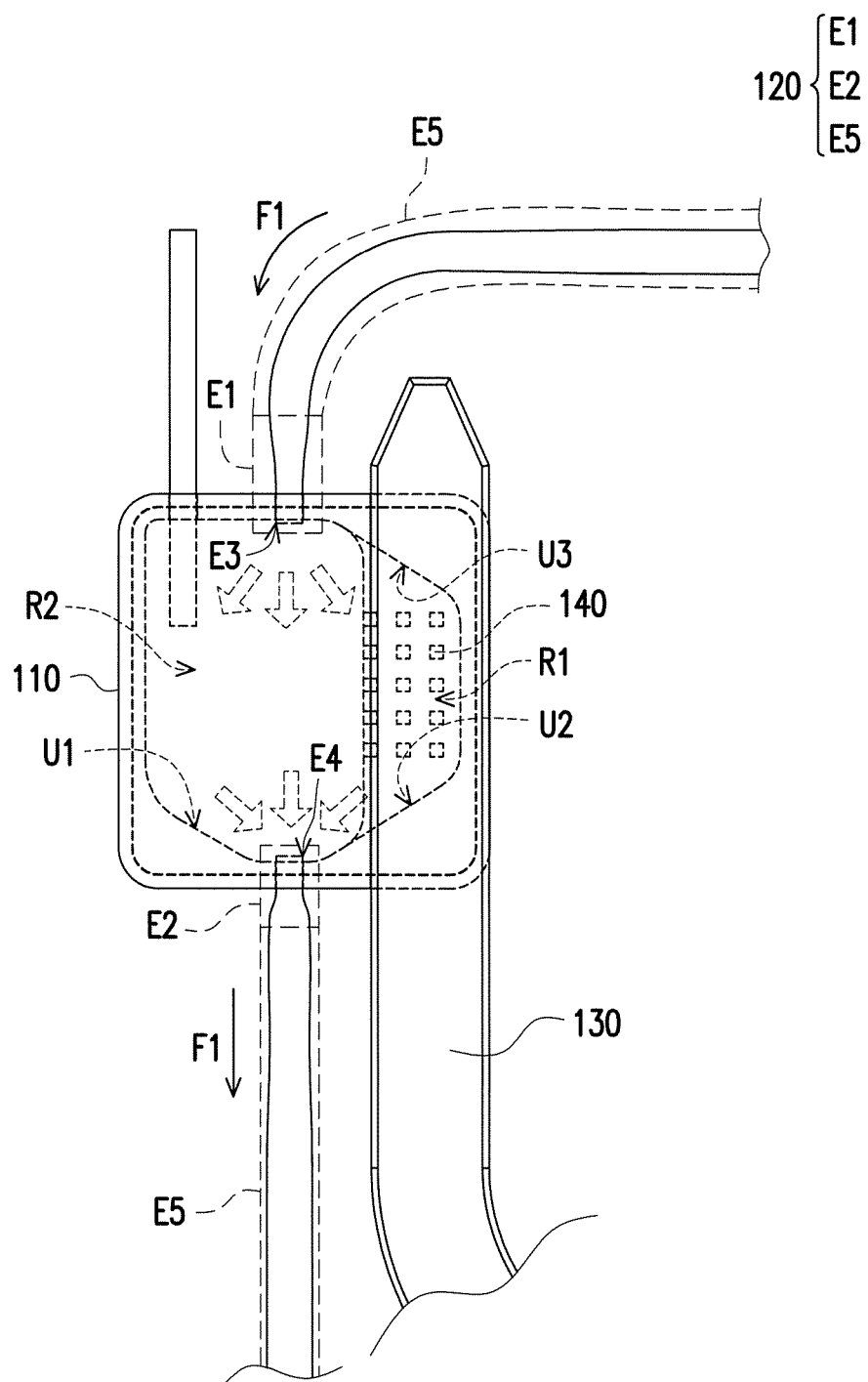
FIG. 5 is a top view illustrating the heat dissipation module of FIG. 3.

FIG. 5 is a top view illustrating the heat dissipation module of FIG. 3. Referring to FIGS. 3 and 5, a structure of a connection portion between the inner space of the evaporator 110 and pipe 120 presents a profile gradually converging towards the pipe 120 in relation to other structure of the inner space. Further speaking, the inner space of the evaporator 110 further includes a first guiding surface U1, a second guiding surface U2 and the third guiding surface U3 located at the periphery of the inner space respectively, wherein the first guiding surface U1 and the second guiding surface U2 are gradually converging from the inner space towards the pipe 120 (namely, the opening E4) while the third guiding surface U3 is gradually converging from the inner space towards the pipe 120 (namely, the opening E3), and gradually converging directions for the two profiles are opposite to each other. In other words, the first guiding surface U1 and the second guiding surface U2 are located at two opposite sides of the opening E4 and are tilted towards the opening E4, while the third guiding surface U3 is adjacent to the opening E3 and is titled towards the opening E3.

Besides, the second guiding surface U2 and the third guiding surface U3 are located at the heating region R1, the first guiding surface is located at the flowing region R2, and the heat conducting components 140 disposed at the heating region R1 is located between the second and the third guiding surfaces.

In view of the above, when the working fluid F1 flows into the inner space of the evaporator 110 through the opening E3, the flow direction thereof will produce a jet stream effect due to a sudden open space formed by the third guiding surface U3, as shown by the dashed-arrows in FIG. 3. Next, the working fluid F1 absorbs the heat mainly through the heat conducting components 140 and a phase transformation is occurred (the working fluid F1 transforms from liquid state to vapor state), and after being converged by the gradually converging profile formed by the first guiding surface U1 and the second guiding surface U2, the working fluid F1 then flows into the pipe 120 through the opening E4.

It is to be mentioned that, although as shown in the present embodiment, only the third guiding surface U3 is located at the opening E3 while the first guiding surface U1 and second guiding surface U2 are located at the opening E4, the present embodiment does not intend to limit the number of guiding surfaces at the two sides of the chamber within the evaporator 110 and their degree of tilt. That is, those skilled in the art should be able to dispose a proper number of guide surfaces at the two openings of the inner space according to the characteristics of the working fluid and the heat dissipation requirements thereof so as to form the structures that gradually converge towards the pipe. On the other hand, the pipe 120 of the present embodiment is substantially divided into a main segment E5 and two end portions E1, E2, wherein the main segment E5 is located between the end portions E1, E2, and the pipe 120 is connected with the openings E3, E4 of the evaporator 110 through the end portions E1, E2 thereof (e.g., the end portion E1 connects to the opening E3, and the end portion E2 connects to the opening E4). Herein, it is to be noted that, at least one of the end portions E1, E2 of the pipe 120 has a structure gradually converging towards the evaporator 110. In other words, a size relationship between the pipe 120 and the inner space of the evaporator 110 of the present embodiment is that: a pipe diameter of the main segment E5 is substantially greater than or equal to a thickness of the inner space of the evaporator 110, and the thickness of the inner space of the evaporator 110 is greater than a pipe diameter of each of the end portions E1, E2.

As a result, since the main segment E5 has a pipe diameter relatively greater than that of the end portions E1, E2, the working fluid F1 can maintain a larger flow and a lower pipeline loss at the main segment E5, and when the working fluid F1 flows from the end portion E1 or E2 into the evaporator 110, through using the gradually converging pipe diameter in collaboration with the gradually converging structure of the inner space of the evaporator 110 (which is a gradually diverging profile to the working fluid F1), the jet stream effect can enhance the working fluid F1 to be uniformly sprayed to every part of the inner space. As previously described, the invention does not limit the flow direction of the working fluid, that is, the heat dissipation module 100 of the present embodiment can enable the working fluid F1 to flow towards different directions in correspondence to a use state of the electronic device 10, and can also enable the working fluid F1 to maintain its flow volume and flow rate regardless of any direction through using the gradually converging pipe diameters of the two end portions E1, E2 of the pipe 120, and thereby achieves the jet stream effect.

Furthermore, the main segment E5 is substantially thermally contacting with the plate body 500, and thus, with the feature that the plate body 500 has a larger area and is made of metal material, a favorable heat transfer effect can be provided so as to enable the vapor state working fluid F1 to attain a condensation effect when flowing through the main segment E5 of the pipe 120 from end portion E2 or E1, so that the vapor state working fluid F1 can be transformed back into the liquid state working fluid F1 and flows into the evaporator 110 through the end portion E1 or E2, again.

Figure 6:
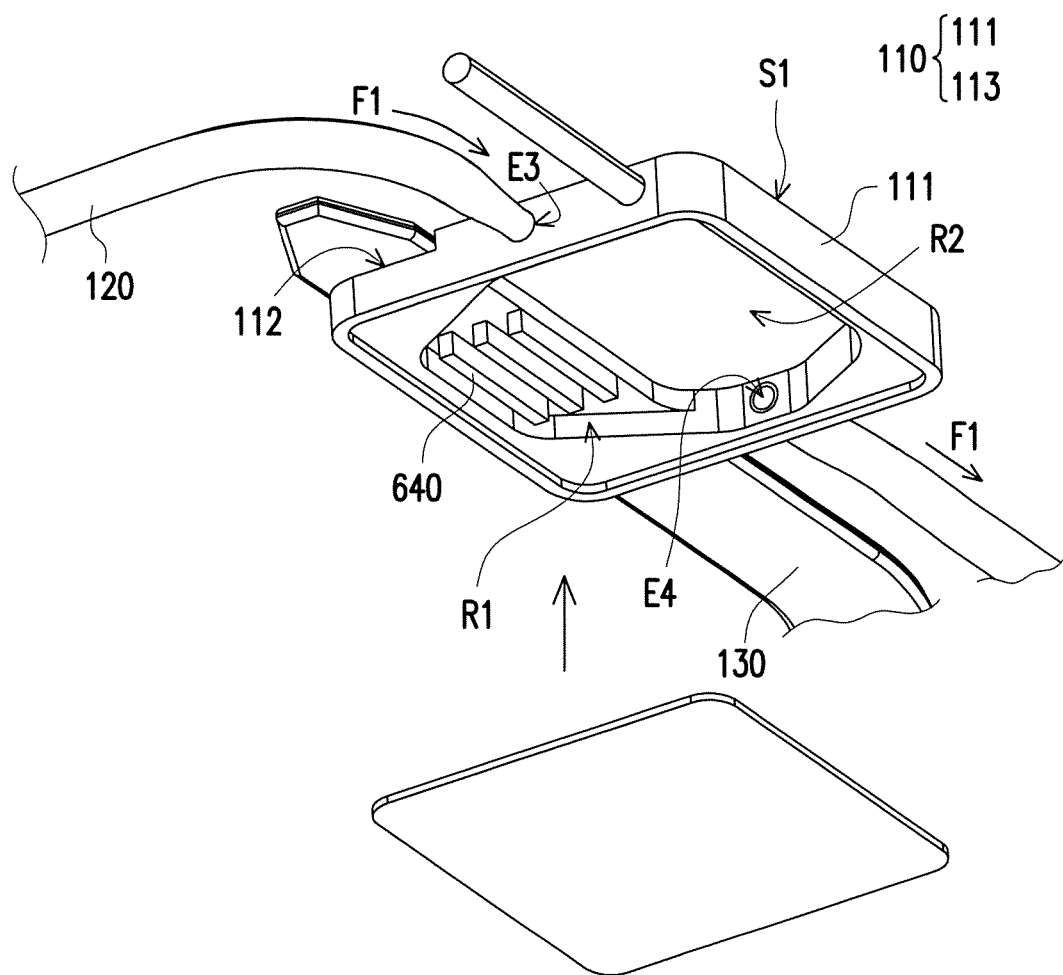
FIG. 6 is a partial sectional view illustrating an evaporator in another embodiment of the present invention.

FIG. 6 is a partial sectional view illustrating an evaporator in another embodiment of the present invention. Referring to FIG. 6, the difference from the aforementioned embodiment is that heat conducting components 640 in the present embodiment are in rib shape, and an extending direction thereof is oriented in a flow direction of the working fluid F1. This configuration can also attain the aforementioned effects of support and heat conduction.

Figure 7:
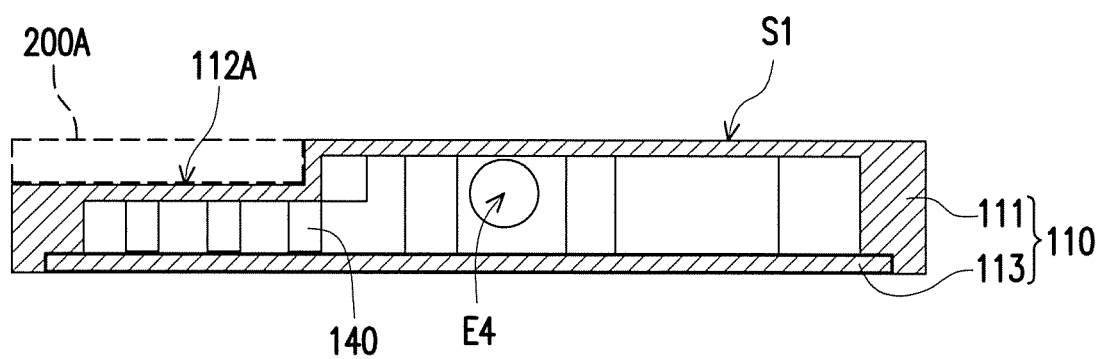
FIG. 7 is a sectional view illustrating the evaporator in another embodiment of the present invention.

FIG. 7 is a sectional view illustrating the evaporator in another embodiment of the present invention. The difference from the aforementioned embodiments is that a heat source 200A in the present embodiment is directly contacted to a recess 112A of an evaporator 110A, so that a heat generated from the heat source 200A can be more directly transferred to the evaporator 110A. The other structure of the present embodiment can be known by the aforementioned embodiments, so that they are omitted here.

Figure 8:
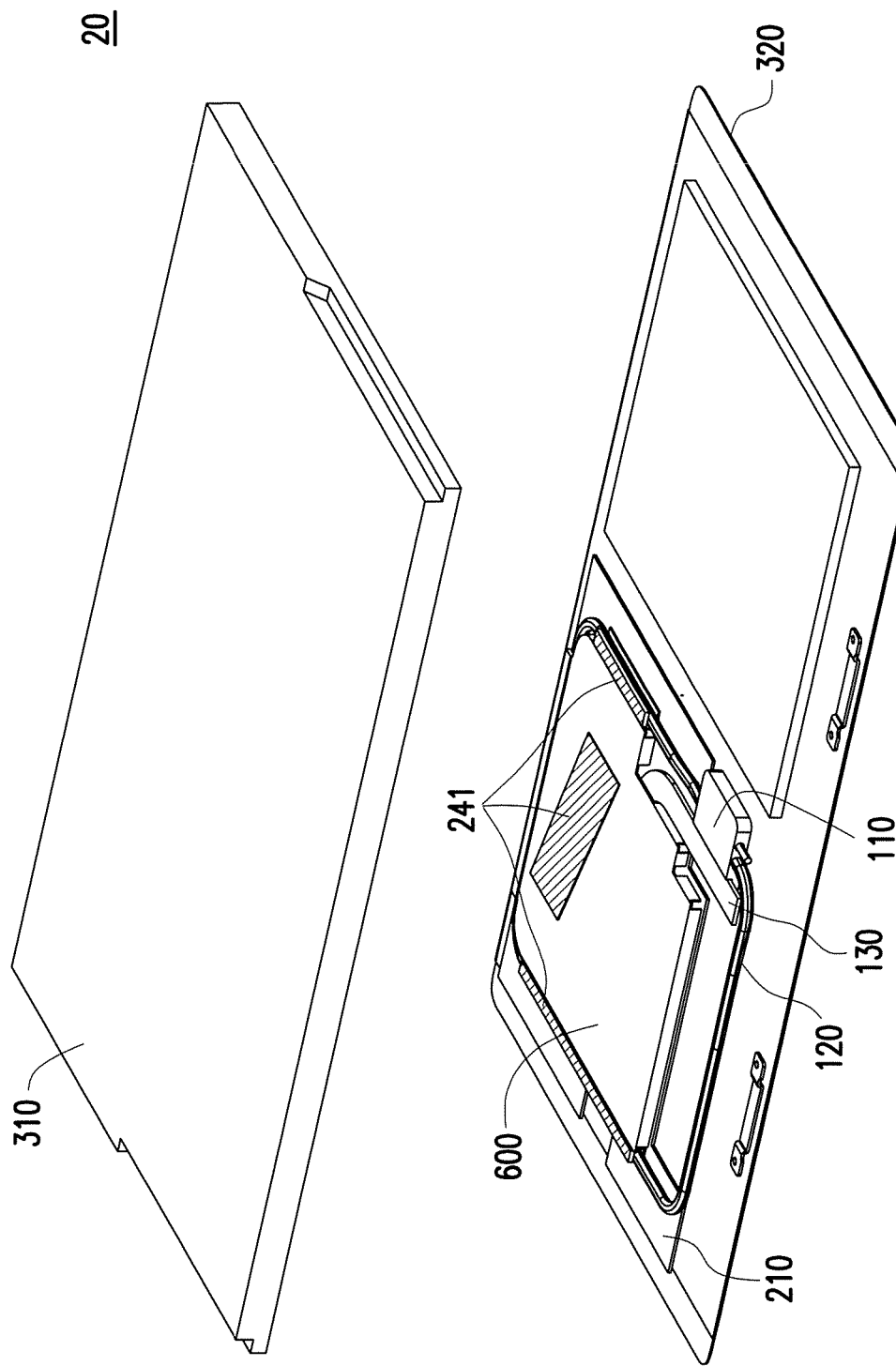
FIG. 8 is a partial exploded view of an electronic device according to another embodiment of the present invention.
Figure 9:
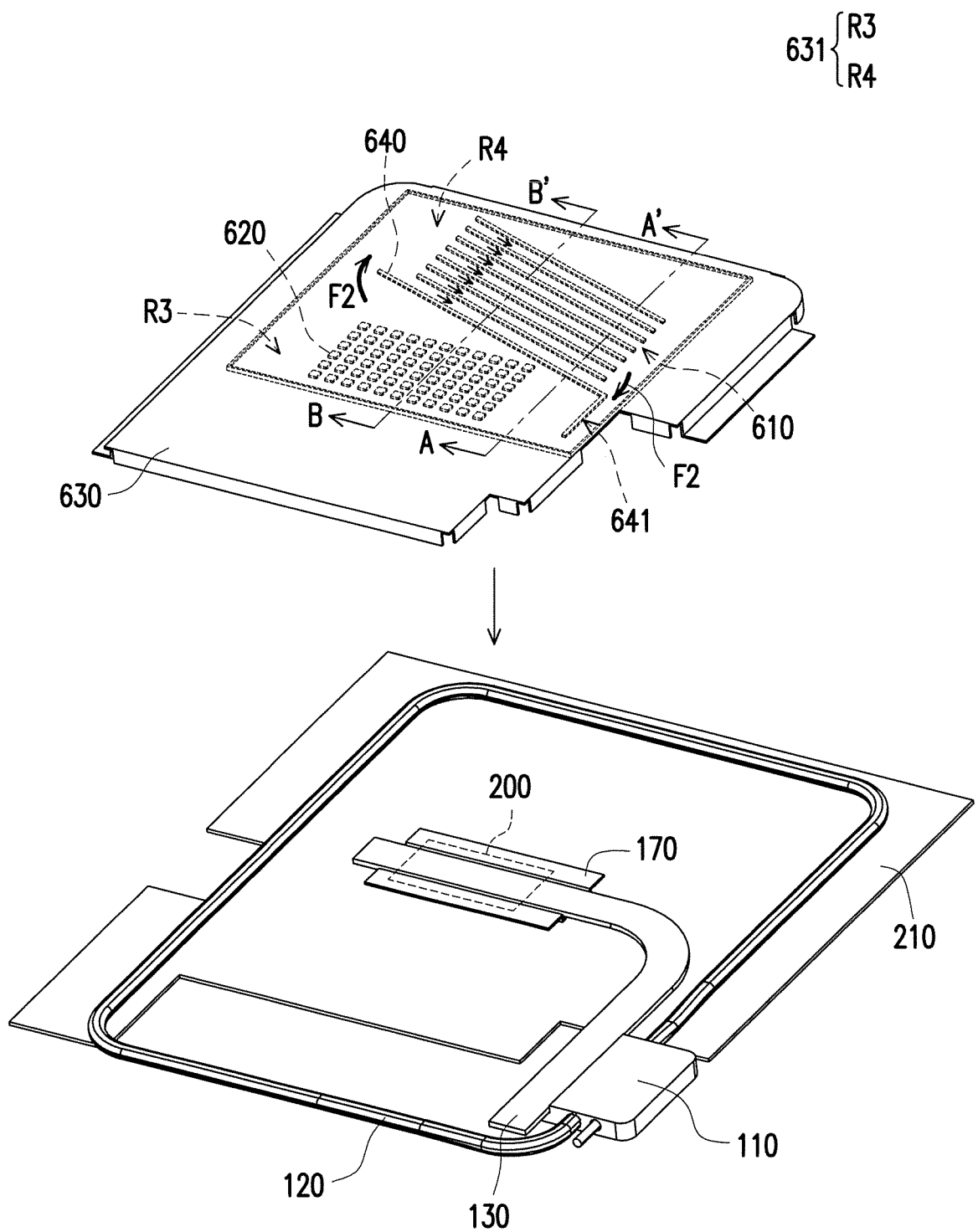
FIG. 9 is a schematic view of the heat dissipation module of FIG. 7.
Figure 10:
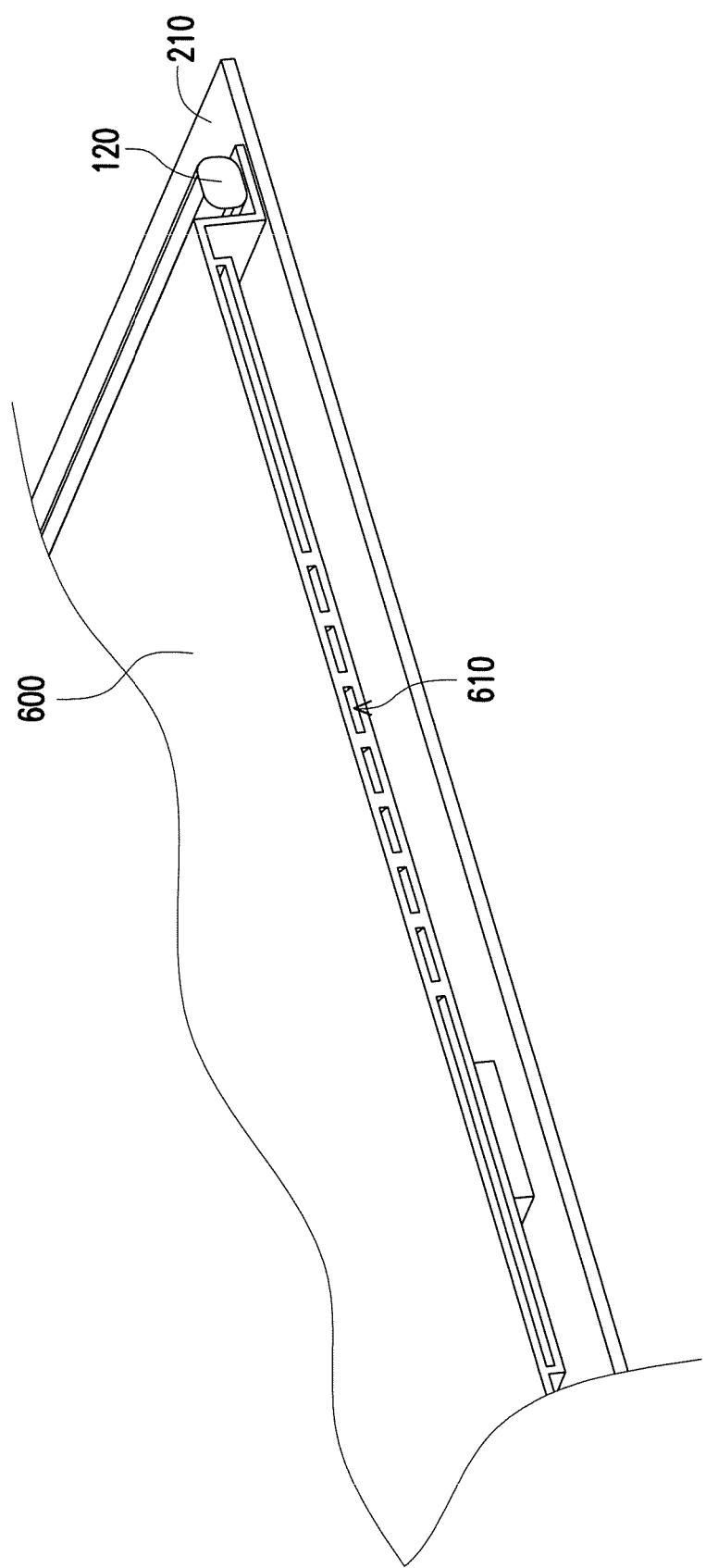
FIG. 10 and FIG. 11 are respective sectional views taken along the line A-A' and line B-B'.
Figure 11:
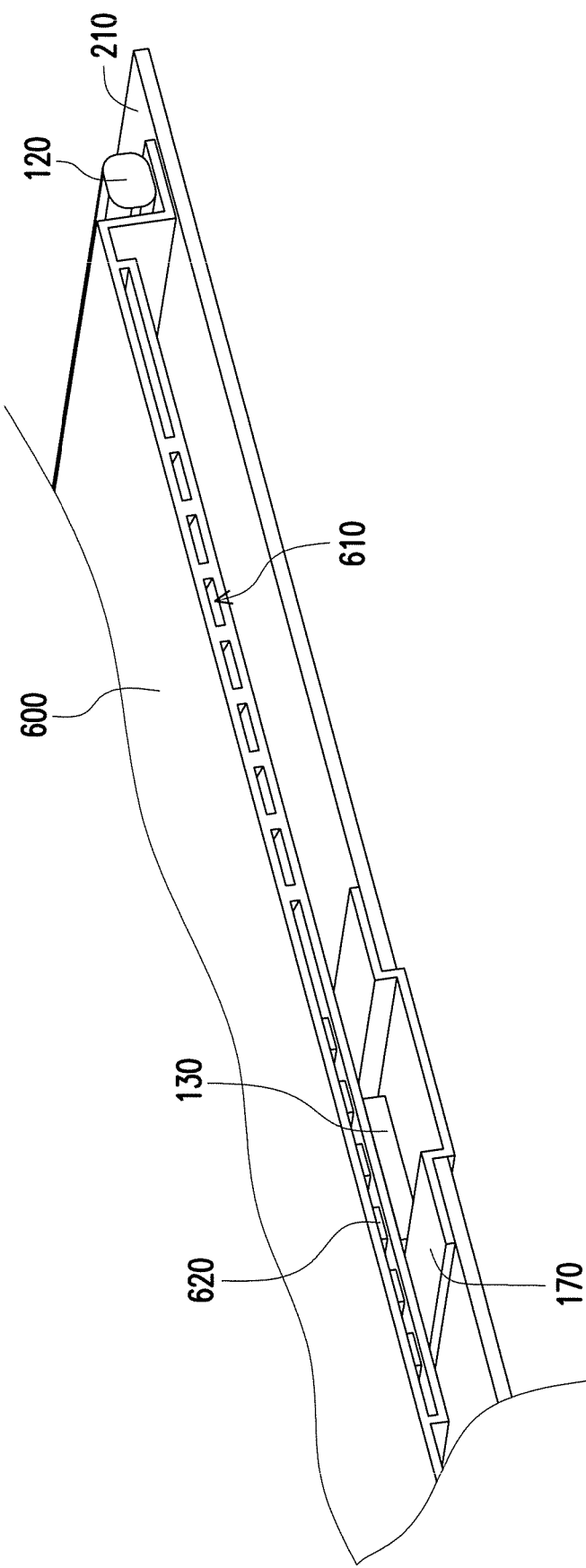

FIG. 8 is a partial exploded view of an electronic device according to another embodiment of the present invention. FIG. 9 is a schematic view of the heat dissipation module of FIG. 8. FIG. 10 and FIG. 11 are respective sectional views taken along the line A-A' and line B-B'. Referring FIG. 8 to FIG. 11, a part of the present embodiment that is the same as the aforementioned embodiments, this includes that a configuration of relative elements of the electronic device 20 is the same as that of the aforementioned electronic device 10. Besides, most elements of a heat dissipation module 600, such as the heat conducting sheet 170, the heat pipe 130, the evaporator 110 and the pipe 120 are the same as those of the aforementioned embodiments. Besides, the heat conducing pads 241 between the pipe 120 and the casing 310, are merely different in appearance that do not affect their function. In other words, the heat transfer paths of the aforementioned embodiments can also be realized in the present embodiment.

Another part of the present embodiment that is different to the aforementioned embodiments is described below. A plate body 630 not only provides the aforementioned EMI shielding effect, and is contacted to the heat conducting sheet 170, the evaporator 110 and the pipe 120 to provide the corresponding condensation effect, but also has an inner space 631 to be a hollow plate body. Besides, a block wall 640 and a plurality of heating pillars 620 are disposed in the inner space 631, wherein the block wall 640 separates the inner space 631 into a heating region R3 and a condensation region R4. Heating pillars 620 are stood in the heating region R3, and a plurality of channels 610 are disposed in the condensation region R4 by disposing a plurality of block-wall-like structures parallel to each other in the condensation region R4. A working fluid F2 is filled in the inner space 631 to flow between the heating region R3 and the condensation region R4.

It is worth noting that, as shown in FIG. 9, as the plate body 640 covers the circuit board 210 to shield the heat source 200 (i.e., the electronic module), the heating region R3 is substantially and correspondingly contacted and stacked on the heat conducting sheet 170 and a heat absorbing end of the heat pipe 130 on the heat source 200 (i.e., the electronic module). Accordingly, the heating region R3 thus can absorb the heat generated from the heat source 200 (i.e., the electronic module) and further heat the working fluid F2 in liquid therein, in order to transform the working fluid F2 to vapor. Such that, the working fluid F2 in vapor can be guided, and flow to the condensation region R4 along with the block wall 640. Afterwards, as shown in FIG. 8, the heat conducting pads 241 are sandwiched between the plate body 630 of the heat dissipation module 600 and the casing 310, so that the working fluid F2 in the condensation region R4 can transfer the heat to the casing 310 through the heat conducting pads 241, so that the heat is then dissipated away from the electronic device 20. Thus, the working fluid F2 in vapor in the channels 610 is gradually condensed to liquid, and then flows back to the heating region R3 again.

It is worth noting that, when the electronic device 20 is placed at certain positions to be, for example, in a standing state, the heating region R3 appears to be under the condensation region R4 of the inner space 631 in the plate body 630. In this case, the channels 610 in the condensation region R4 substantially appear to be extending along with a direction from upper left to lower right, thus the working fluid F2 can be circulated more efficiently in the inner space 631, and properties of the working fluid F2 is better exploited to attain higher working efficiency.

In addition, the block wall 640 further comprises backflow prevention part 641 at where the working fluid F2 flows back from the condensation region R4 to the heating region R3. The backflow prevention part 641 is extended from the condensation region R4 toward the heating region R3, in order to serve as a guiding structure that guides the working fluid F2 in liquid to flow back to the heating region R3, and also avoid the working fluid F2 in vapor from flowing from the heating region R3 to the condensation region R4, which disrupts a fluid circulation.

Besides, in another embodiment not being illustrated, the channels 610 shown in FIG. 9 can also be disposed at two opposite sides of the heating pillars 620 at the same time. In other words, the channels 610 shown in FIG. 9 are further disposed at the opposite side of the heating pillars 620, so that the heating region R3 is located between two condensation regions R4. This configuration can attain an effect of circulation of the working fluid F2 through the heating pillar 620 and the channels 610 in the inner space 631 of the plate body 630, while the electronic device 20 is used with different angles. That is, appropriate number of the condensation regions R4 can be disposed around the heating region R3 by users according to their requirements. Such that, the plate body 630 can realize a heat dissipation efficiency in correspondence to different usage states of the electronic device 20, in order to improve an applicability of the heat dissipation effect of the plate body 630.

In view of above, in the above mentioned embodiments of the present invention, a heat dissipation module is thermally contacted to a heat source through a recess of an evaporator, to absorb a heat generated from the heat source effectively according to the structure of appearance thereof. In addition, an effect of compact disposition of the structure of the heat dissipation module is attained, so that elements in the electronic device can be better disposed, and a space utilization efficiency in the electronic device is improved. Moreover, thickness of walls at the recess of the evaporator is smaller than thickness of the other walls of the evaporator, which is beneficial for transferring the heat to a working fluid in an inner space of the evaporator. A plurality of heat conduction components is disposed in the inner space of the evaporator corresponding to the recess, in order to increase a heat conduction area and a heat conduction efficiency between the evaporator and the working fluid. In one of the embodiments, the heat generated from the heat source is transferred to the evaporator through a heat pipe, and the recess is substantially filled up by the heat pipe. Therefore, a structure strength at the recess of the evaporator is improved, and it is beneficial for designers to dispose elements in the electronic device according to a compact disposition of the heat pipe and the evaporator. Moreover, the heat pipe and a pipe of the heat dissipation module can be contacted to a plate body of the electronic device, so that the heat is uniformly transferred to all over the plate body and the heat dissipation module through the plate body, which is advantageous to dissipate the heat.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heat dissipation module, which is suitable for an electronic device having a heat source, the heat dissipation module comprising:
    an evaporator, having a recess at an exterior surface of the evaporator, the recess forming a heat conducting zone to absorb heat generated from the heat source;
    a heat pipe, thermally contacted to the heat source and disposed between the heat source and the evaporator, and the heat pipe is structurally contacted to the recess to transfer heat from the heat source to the evaporator;
    a plurality of heat conducting components, disposed in the evaporator, located at an interior of the evaporator corresponding to the heat conducting zone, and the plurality of heat conducting components being in pillar shape or rib shape respectively;
    a pipe, disposed outside the evaporator and connected to two openings disposed at opposite sidewalls of the evaporator that face each other in the interior of the evaporator so as to form a loop; and
    a working fluid filled in the loop, wherein the working fluid in liquid enters the evaporator from the pipe via one of the two openings, passes through the evaporator, absorbs heat, and is transformed into vapor to flow out of the evaporator and flow into the pipe via the other one of the two openings, wherein each of the heat conducting components in rib shape is oriented in a flow direction of the working fluid.

* * * * *